United States Patent
Choi

(10) Patent No.: US 11,599,143 B2
(45) Date of Patent: Mar. 7, 2023

(54) FLEXIBLE DISPLAY MODULE AND ELECTRONIC DEVICE INCLUDING THE SAME

(71) Applicant: Samsung Electronics Co., Ltd., Suwon-si (KR)

(72) Inventor: Jonghwan Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 165 days.

(21) Appl. No.: 16/724,749

(22) Filed: Dec. 23, 2019

(65) Prior Publication Data
US 2020/0201385 A1 Jun. 25, 2020

(30) Foreign Application Priority Data

Dec. 24, 2018 (KR) .......................... 10-2018-0168215
Feb. 19, 2019 (KR) .......................... 10-2019-0018900

(51) Int. Cl.
*G06F 1/00* (2006.01)
*G06F 1/16* (2006.01)
(Continued)

(52) U.S. Cl.
CPC .......... *G06F 1/1616* (2013.01); *G06F 1/1652* (2013.01); *H04M 1/0268* (2013.01); *H05K 1/189* (2013.01)

(58) Field of Classification Search
CPC .. G06F 1/1616; G06F 1/1652; H04M 1/0268; H05K 1/189
See application file for complete search history.

(56) References Cited

U.S. PATENT DOCUMENTS 9,348,450 B1   5/2016  Kim
10,495,941 B2 * 12/2019 Hashimoto ........... G06F 1/1643
(Continued)

FOREIGN PATENT DOCUMENTS

CN        105929990 A     9/2016
EP          3330832 A1    6/2018
(Continued)

OTHER PUBLICATIONS

International Search Report dated Apr. 2, 2020; International Appln. No. PCT/KR2019/018296.
(Continued)

*Primary Examiner* — Pete T Lee
(74) *Attorney, Agent, or Firm* — Jefferson IP Law, LLP

(57) ABSTRACT

An electronic device is provided. The electronic device includes a housing, a display, a middle plate, an adhesive layer, a support layer, and a coating layer. The housing includes a front plate facing a direction, a rear plate facing an opposite direction, and a lateral member surrounding a space between the front and rear plate. The display is configured to be seen through the front plate, and includes a first and second surface. The middle plate is disposed between the display and the rear plate, and includes a surface facing the display, and a recess. The adhesive layer is attached to the display, and the support layer is disposed between the adhesive layer and the middle plate. The coating layer is disposed between the support layer and the adhesive layer and is disposed in a first portion overlapped with the recess when viewed from the display.

20 Claims, 15 Drawing Sheets

(51) Int. Cl.
*H05K 1/18* (2006.01)
*H04M 1/02* (2006.01)

(56) References Cited

U.S. PATENT DOCUMENTS

| | | | |
|---|---|---|---|
| 10,727,435 B2* | 7/2020 | Kim | G06F 1/1601 |
| 10,824,189 B2* | 11/2020 | Lin | H05K 5/0226 |
| 2013/0016303 A1 | 1/2013 | Tokunaga | |
| 2013/0083496 A1* | 4/2013 | Franklin | H01M 50/463 |
| | | | 361/752 |
| 2014/0042406 A1* | 2/2014 | Degner | H01L 51/0097 |
| | | | 438/34 |
| 2015/0361696 A1 | 12/2015 | Tazbaz | |
| 2016/0255713 A1 | 9/2016 | Kim et al. | |
| 2017/0233606 A1 | 8/2017 | Park et al. | |
| 2017/0311442 A1* | 10/2017 | Eom | G02F 1/13452 |
| 2018/0076236 A1 | 3/2018 | Kwon et al. | |
| 2018/0097199 A1 | 4/2018 | Jo et al. | |
| 2018/0110139 A1 | 4/2018 | Seo et al. | |
| 2018/0160545 A1 | 6/2018 | Kim et al. | |

FOREIGN PATENT DOCUMENTS

| | | |
|---|---|---|
| JP | 2009-229487 A | 10/2009 |
| KR | 10-2016-0083608 A | 7/2016 |
| KR | 10-2018-0036323 A | 4/2018 |

OTHER PUBLICATIONS

Extended European Search Report dated Oct. 27, 2021, issued in European Application No. 19903803.5-1216.
Chinese Office Action dated Oct. 19, 2022, issued in Chinese Application No. 201980085566.X.
European communication dated Dec. 8, 2022, issued in European Application No. 19 903 803.5-1224.

* cited by examiner

FLEXIBLE DISPLAY MODULE AND ELECTRONIC DEVICE INCLUDING THE SAME

CROSS-REFERENCE TO RELATED APPLICATION(S)

This application is based on and claims priority under 35 U.S.C. § 119(a) of a Korean patent application number 10-2018-0168215, filed on Dec. 24, 2018, in the Korean Intellectual Property Office, and of a Korean patent application number 10-2019-0018900, filed on Feb. 19, 2019, in the Korean Intellectual Property Office, the disclosure of which is incorporated by reference herein in its entirety.

BACKGROUND

1. Field

The disclosure relates to a flexible display module and an electronic device including the same.

2. Description of Related Art

Normally an electronic device has a display to visually offer information to a user. Such displays have been developed and improved in various aspects with the growths of electronic devices. For example, the resolution becomes higher to realize an enhanced image quality, and the thickness becomes thinner to reduce power consumption. In recent years, a flexible display that allows a variation in shape in accordance with a change in shape of the electronic device has been studied and developed.

In the flexible display, a support layer is attached over the entire area of the display to support the display. Thus, when the support layer is deformed by external force, the deformed shape may be transferred to a window surface of the display. In addition, surface irregularities (e.g., differences in thickness) of a middle plate in the display may be exposed to the window surface.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic device that prevents a deformed shape from appearing on a window surface of a display even when a support layer attached to the display is deformed by an external force.

Additional aspects will be set forth in part in the description which follows and, in part, will be apparent from the description, or may be learned by practice of the presented embodiments.

In accordance with an aspect of the disclosure, an electronic device is provided. The electronic device includes a housing including a front plate facing a first direction, a rear plate facing a second direction opposite to the first direction, and a lateral member surrounding a space between the front plate and the rear plate, a display configured to be seen through at least a portion of the front plate and including a first surface facing the first direction and a second surface facing the second direction, a middle plate disposed between the display and the rear plate, including a third surface facing the second surface of the display and a recess formed on the third surface, an adhesive layer attached to the second surface of the display, a support layer disposed between the adhesive layer and the middle plate, and a coating layer disposed between the support layer and the adhesive layer and disposed in a first portion overlapped with the recess when viewed from the display.

In accordance with another aspect of the disclosure, an electronic device is provided. The electronic device includes a housing including a front plate facing a first direction, a rear plate facing a second direction opposite to the first direction, and a lateral member surrounding a space between the front plate and the rear plate, a display configured to be seen through at least a portion of the front plate and including a first surface facing the first direction and a second surface facing the second direction, a middle plate disposed between the display and the rear plate, including a third surface facing the second surface of the display and a recess formed on the third surface, an adhesive layer attached to the second surface of the display and including an opening formed in a first portion overlapped with the recess when viewed from the display, and a support layer disposed between the adhesive layer and the middle plate.

In accordance with another aspect of the disclosure, a flexible display module is provided. The flexible display module includes a front plate facing a first direction and configured to be foldable, a display configured to be seen through at least a portion of the front plate and including a first surface facing the first direction and a second surface facing a second direction opposite to the first direction, an adhesive layer attached to the second surface of the display, a support layer combined with the adhesive layer, and a coating layer disposed between at least part of the support layer and the adhesive layer.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
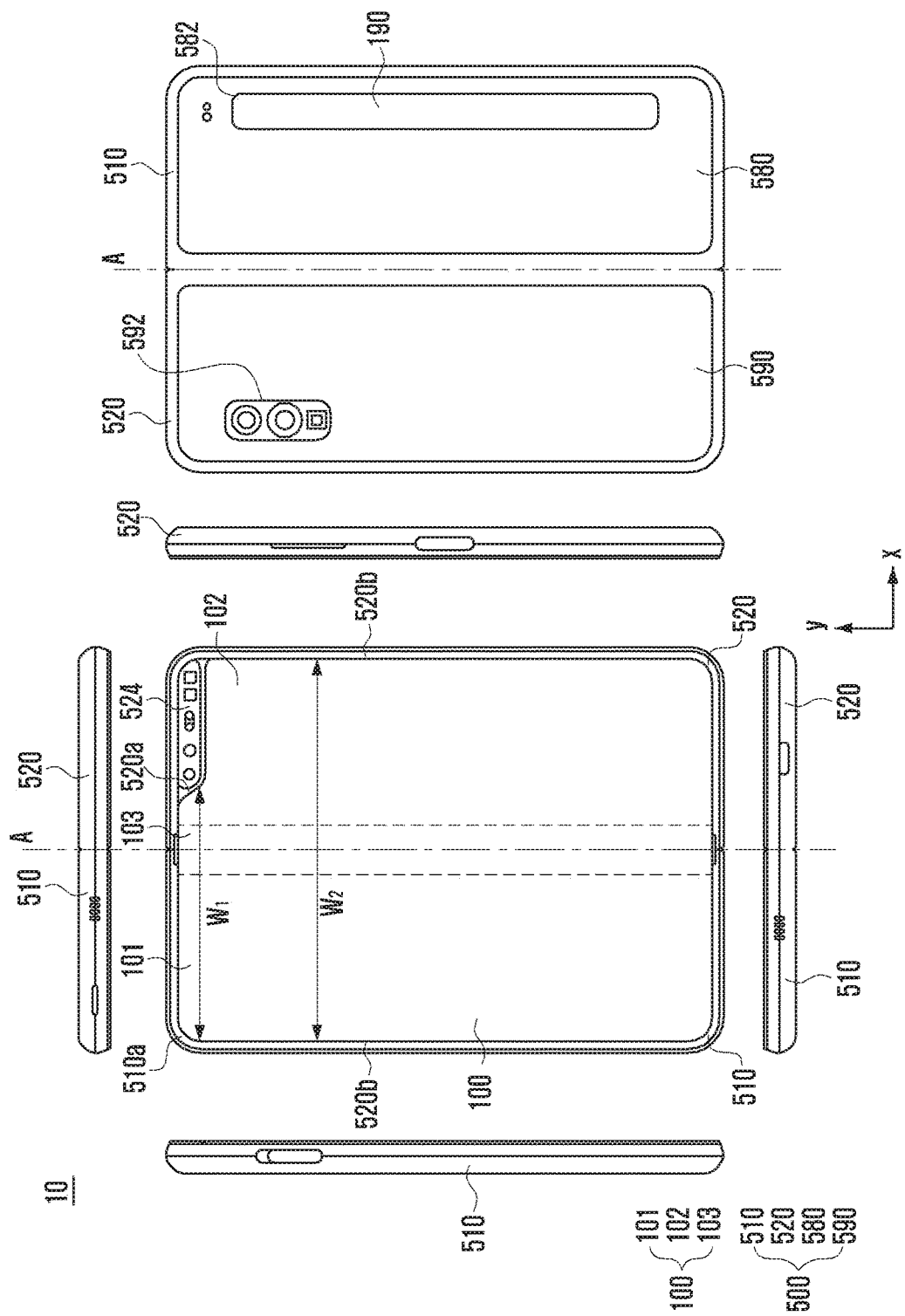
FIG. 1 is a view showing an unfolded state of an electronic device according to an embodiment of the disclosure.

FIG. 1 is a view showing an unfolded state of an electronic device according to an embodiment of the disclosure.

Figure 2:
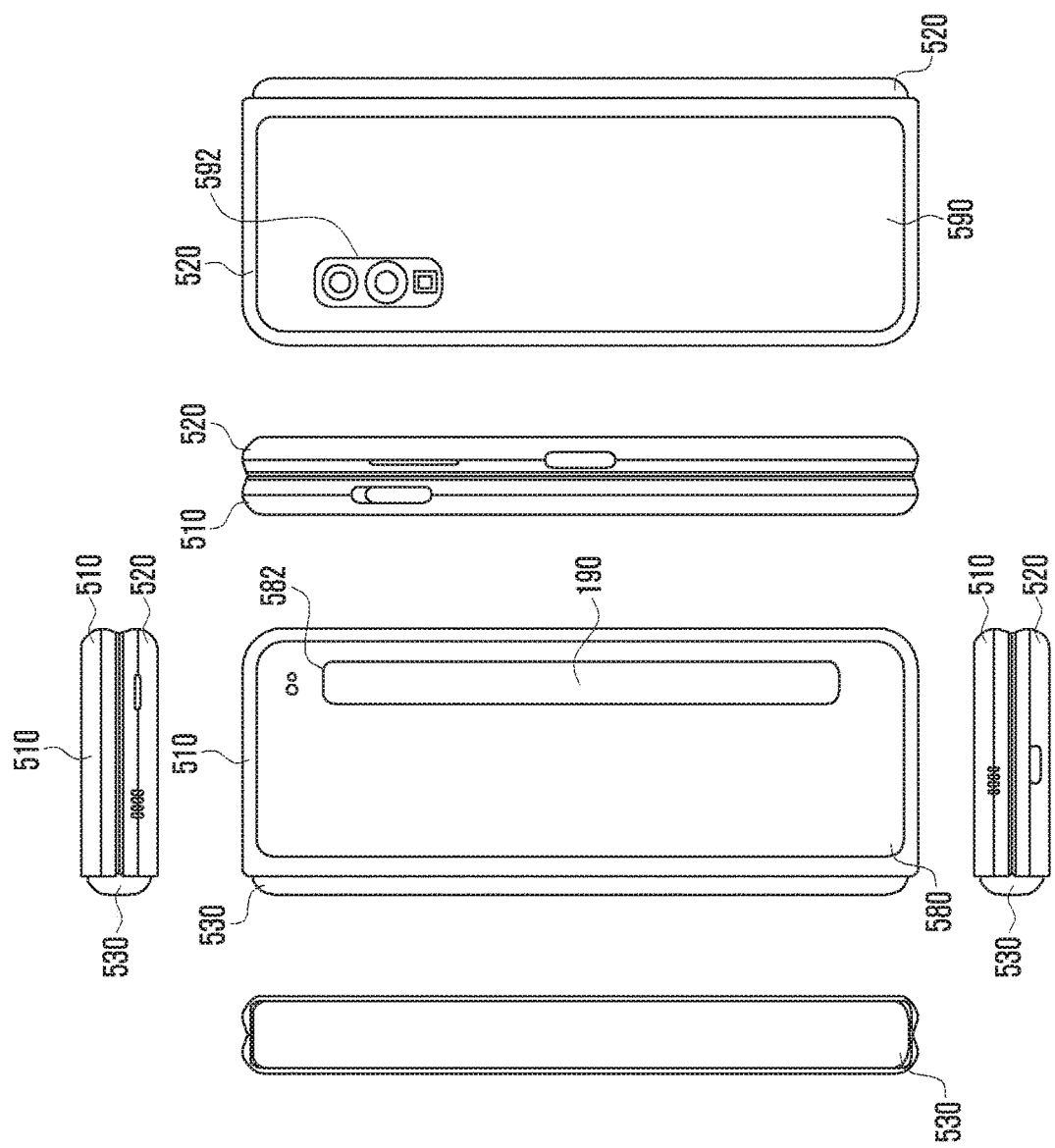
FIG. 2 is a view showing a folded state of an electronic device according to an embodiment of the disclosure.

FIG. 2 is a view showing a folded state of an electronic device according to an embodiment of the disclosure.

Referring to FIGS. 1 and 2, in an embodiment, the electronic device 10 may include a foldable housing 500, a hinge cover 530 that covers a foldable portion of the foldable housing 500, and a flexible or foldable display 100 (which may hereinafter, be referred to as "display 100") disposed in a space defined by the foldable housing 500. In the disclosure, a surface on which the display 100 is disposed may, for example, be referred to as a first surface or a front surface of the electronic device 10. In addition, the opposite surface of the front surface may, for example, be referred to as a second surface or a rear surface of the electronic device 10. Also, a surface surrounding a space between the front and rear surfaces may, for example, be referred to as a third surface or a lateral surface of the electronic device 10.

In an embodiment, the foldable housing 500 may include a first housing structure (e.g., a first housing) 510, a second housing structure (e.g., a second housing) 520 having a sensor area 524, a first rear cover 580, and a second rear cover 590. The foldable housing 500 of the electronic device 10 is not limited to the shape and configuration shown in FIGS. 1 and 2, and may be implemented with any other shape and configuration. For example, and without limitation, in another embodiment, the first housing 510 and the first rear cover 580 may be integrally formed, and also the second housing 520 and the second rear cover 590 may be integrally formed.

In the illustrated embodiment, the first housing 510 and the second housing 520 are disposed at both sides with respect to a folding axis (indicated by 'A'), and may have a generally symmetric shape with respect to the folding axis (A). As will be described in greater detail below, the first and second housings 510 and 520 may have different angles or distances therebetween, depending on whether the electronic device 10 is in a flat (e.g., unfolded) state, a folded state, or an intermediate state. In the illustrated embodiment, the second housing 520 has the sensor area 524 in which various sensors are disposed. Excepting the provision of the sensor area 524, both housings may be substantially symmetrical in shape.

In an embodiment, as shown in FIG. 1, the first housing 510 and the second housing 520 may together include a recess for accommodating the display 100 therein. In the illustrated embodiment, the recess may have two or more different widths in a direction perpendicular to the folding axis (A) because of the sensor area 524.

For example, the recess may have a first width (W1) between a first portion 510a of the first housing 510 parallel to the folding axis (A) and a first portion 520a of the second housing 520 formed at one edge of the sensor area 524, and a second width (W2) between a second portion 510b of the first housing 510 parallel to the folding axis (A) and a second portion 520b of the second housing 520 not corresponding to the sensor area 524 and being parallel to the folding axis (A). In this example, the second width (W2) may be greater than the first width (W1). In other words, the first portion 510a of the first housing 510 and the first portion 520a of the second housing 520, which have asymmetrical shapes, define the first width (W1) of the recess, whereas the second portion 510b of the first housing 510 and the second portion 520b of the second housing 520, which have symmetrical shapes, define the second width (W2) of the recess. In an embodiment, the first portion 520a and the second portion 520b of the second housing 520 may have different distances from the folding axis (A). The width of the recess is not limited to the illustrated example. In various embodiments, the recess may have a plurality of different widths depending on the shape of the sensor area 524 or asymmetrical shapes of the first and second housings 510 and 520.

In an embodiment, at least a portion of the first and second housings 510 and 520 may comprise a metallic or non-metallic material having a selected rigidity value to support the display 100.

In an embodiment, the sensor area 524 may occupy a certain region adjacent to one corner of the second housing 520. The arrangement, shape, and size of the sensor area 524 are not limited to the illustrated example. For example, in other embodiments, the sensor area 524 may be disposed at any other corner of the second housing 520 or at any position between top and bottom corners. In an embodiment, components for performing various functions may be embedded in the electronic device 10 and exposed to the front surface of the electronic device 10 through the sensor area 524 or through one or more openings provided in the sensor area 524. In various embodiments, such components may include various types of sensors, which may include, for example, and without limitation, at least one of a front camera, a receiver, a proximity sensor, or the like.

The first rear cover 580 is disposed on one side of the folding axis on the rear surface of the electronic device 10. The first rear cover 580 may have, for example, a substantially rectangular periphery surrounded by the first housing 510. Similarly, the second rear cover 590 is disposed on the other side of the folding axis on the rear surface of the electronic device 10, and a substantially rectangular periphery thereof may be surrounded by the second housing 520.

In the illustrated embodiment, the first rear cover 580 and the second rear cover 590 may have a substantially symmetrical shape with respect to the folding axis (A). This is, however, not essential. In another embodiment, the electronic device 10 may include the first and second rear covers 580 and 590 having various shapes. In still another embodiment, the first rear cover 580 may be integrally formed with the first housing 510, and the second rear cover 590 may be integrally formed with the second housing 520.

In an embodiment, the first rear cover 580, the second rear cover 590, the first housing 510, and the second housing 520 may together define a space in which various components of the electronic device 10 (e.g., a printed circuit board or a battery) are disposed. In an embodiment, one or more components may be disposed near and visually exposed to the rear surface of the electronic device 10. For example, at least a portion of a sub display 190 may be visually exposed through a first rear area 582 of the first rear cover 580. In another embodiment, one or more components or sensors may be visually exposed through a second rear area 592 of the second rear cover 590. In various embodiments, such sensors may include, for example, and without limitation, a proximity sensor and/or a rear camera, or the like.

Referring to FIG. 2, the hinge cover 530 is disposed between the first housing 510 and the second housing 520 and may be configured to cover an internal component (e.g., a hinge). In an embodiment, depending whether the electronic device 10 is in a flat state or in a folded state, the hinge cover 530 may be hidden by a part of the first and second housings 510 and 520 or exposed to the outside.

For example, when the electronic device 10 is in the flat state as shown in FIG. 1, the hinge cover 530 may be hidden by the first and second housings 510 and 520, thus being not exposed. Also, when the electronic device 10 is in the folded state (e.g., a fully folded state) as shown in FIG. 2, the hinge cover 530 may be exposed to the outside between the first and second housings 510 and 520. In the case of an intermediate state in which the first and second housings 510 and 520 are folded at a certain angle, the hinge cover 530 may be partially exposed to the outside between the first and second housings 510 and 520. The exposed area in the intermediate state may be smaller than that in the fully folded state. In an embodiment, the hinge cover 530 may have a curved surface.

The display 100 may be disposed in the space defined by the foldable housing 500. For example, the display 100 may be mounted in the recess formed by the foldable housing 500 while forming most of the front surface of the electronic device 10.

Therefore, the front surface of the electronic device 10 may include the display 100, a portion of the first housing 510 adjacent to the display 100, and a portion of the second housing 520. In addition, the rear surface of the electronic device 10 may include the first rear cover 580, a portion of the first housing 510 adjacent to the first rear cover 580, the second rear cover 590, and a portion of the second housing 520 adjacent to the second rear cover 590.

The display 100 may refer to a display that allows at least a portion thereof to be deformed into a curved surface. In an embodiment, as shown in FIG. 1, the display 100 may include a folding area 103, a first area 101 disposed on one side with respect to the folding area 103 (e.g., the left side of the folding area 103 shown in FIG. 1), and a second area 102 disposed on the other side with respect to the folding area 103 (e.g., the right side of the folding region 103 shown in FIG. 1).

The divided areas of the display 100 illustrated in FIG. 1 is an example only, and the display 100 may be divided into a plurality of areas (e.g., two, four or more) according to the structure or function thereof. For example, unlike being divided into areas based on the folding area 103 or the folding axis (A) each parallel to the y-axis in the illustrated FIG. 1 embodiment, the display 100 in another embodiment may be divided into areas based on another folding area or folding axis (e.g., each parallel to the x-axis).

The first area 101 and the second area 102 may have a symmetrical shape as a whole with respect to the folding area 103. However, unlike the first area 101, the second area 102 may have a cut portion to expose the sensor area 524, resulting in an asymmetrical shape. Therefore, the first and second areas 101 and 102 may have a symmetrical portion and an asymmetrical portion.

Hereinafter, in each particular state of the electronic device 10, the operations of the first and second housings 510 and 520 and the respective areas of the display 100 will be described.

In an embodiment, when the electronic device 10 is in a flat state (e.g., FIG. 1), the first housing 510 and the second housing 520 are disposed to form an angle of 180 degrees and face the same direction. Thus, the surfaces of the first and second areas 101 and 102 of the display 100 form an angle of 180 degrees with each other and face the same direction (e.g., the front direction of the electronic device). In addition, the folding area 103 may form the same plane as the first and second areas 101 and 102.

In an embodiment, when the electronic device 10 is in a folded state (e.g., FIG. 2), the first housing 510 and the second housing 520 are disposed to face each other. Thus, the surfaces of the first and second areas 101 and 102 of the display 100 form a small angle (e.g., between 0 and 10 degrees) and face each other. In addition, the folding area 103 may be formed to have partially a curved surface having a certain curvature.

In an embodiment, when the electronic device 10 is in an intermediate state, the first housing 510 and the second housing 520 are disposed to form a certain angle. Thus, the surfaces of the first and second areas 101 and 102 of the display 100 form a certain angle which is greater than the angle in the folded state and smaller than the angle in the flat state. In addition, the folding area 103 may be formed to have partially a curved surface having a certain curvature. This curvature is smaller than the curvature in the folded state.

Figure 3:
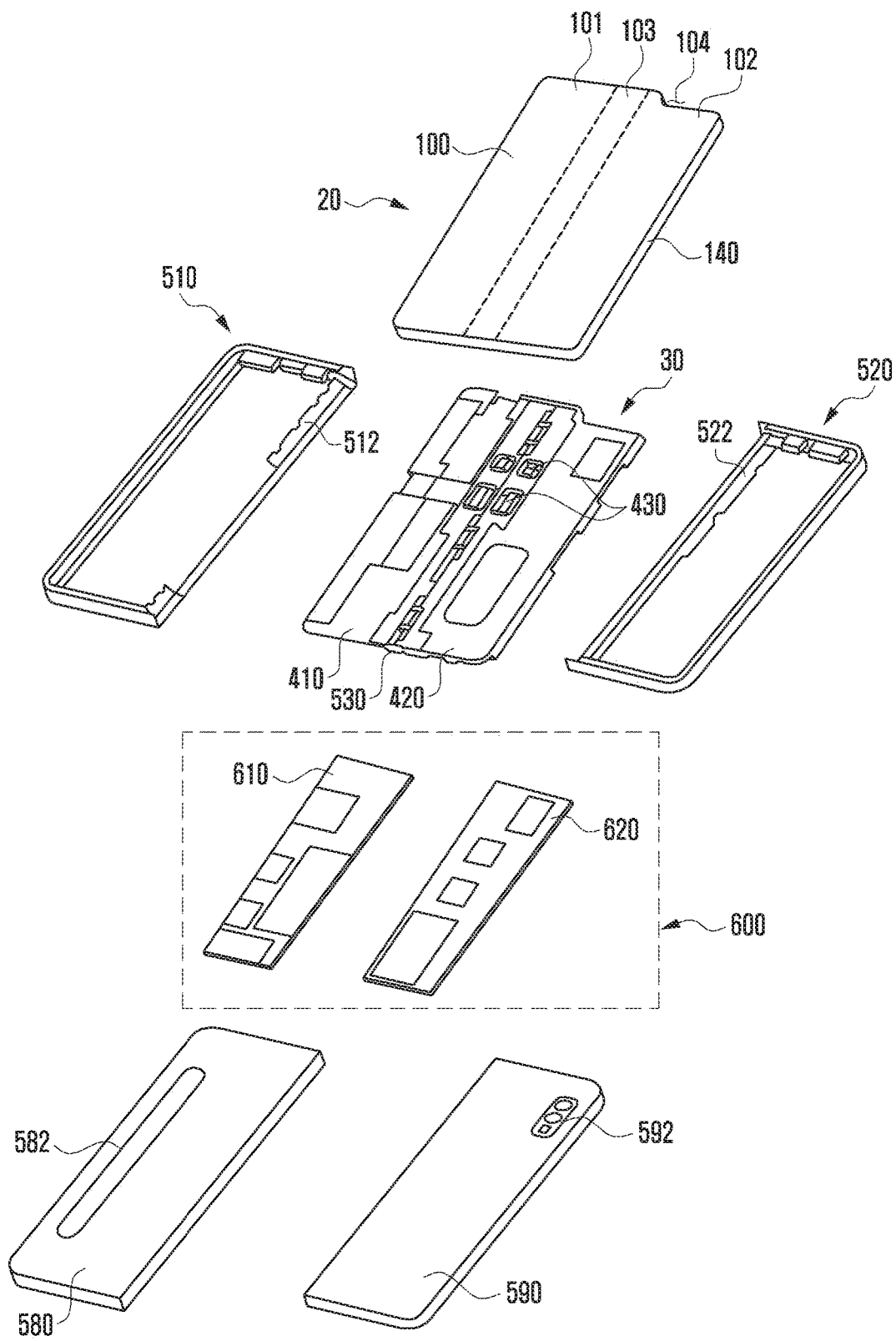
FIG. 3 is an exploded perspective view of an electronic device according to an embodiment of the disclosure.

FIG. 3 is an exploded perspective view illustrating an example foldable electronic device according to an embodiment.

Referring to FIG. 3, in an embodiment, the electronic device 10 may include a display unit (e.g., including a display) 20, a bracket assembly (e.g., including a bracket) 30, a substrate unit (e.g., including a substrate) 600, the first housing 510, the second housing 520, the first rear cover 580, and the second rear cover 590. In the disclosure, the display unit 20 may be also referred to as a display module or a display assembly.

The display unit 20 may include the display 100 and at least one plate or layer 140 on which the display 100 is mounted. In an embodiment, the plate 140 may be disposed between the display 100 and the bracket assembly 30. The display 100 may be disposed on at least a portion of one surface (e.g., the upper surface in FIG. 3) of the plate 140. The plate 140 may have a shape corresponding to the display 100. For example, a portion of the plate 140 may have a shape corresponding to a cut portion 104 of the display 100.

The bracket assembly 30 may include a first bracket 410, a second bracket 420, a hinge structure (e.g., including a hinge) disposed between the first and second brackets 410 and 420, the hinge cover 530 covering the hinge structure, and a wiring member 430 (e.g., a flexible printed circuit (FPC)) intersecting with the first and second brackets 410 and 420.

In an embodiment, the bracket assembly 30 may be disposed between the plate 140 and the substrate unit 600. For example, the first bracket 410 may be disposed between the first area 101 of the display 100 and a first substrate 610 of the substrate unit 600. The second bracket 420 may be disposed between the second area 102 of the display 100 and a second substrate 620 of the substrate unit 600.

In an embodiment, the wiring member 430 and the hinge structure may be disposed, at least in part, inside the bracket assembly 30. The wiring member 430 may be disposed in a direction (e.g., the x-axis direction) that crosses the first and second brackets 410 and 420. The wiring member 430 may be disposed in a direction perpendicular to a folding axis (e.g., the y-axis or the folding axis (A) in FIG. 1) of the folding area 103 of the electronic device 10.

As mentioned above, the substrate unit 600 may include the first substrate 610 disposed to correspond to the first bracket 410, and the second substrate 620 disposed to correspond to the second bracket 420. The first and second substrates 610 and 620 may be disposed in a space formed by all or substantially all of the bracket assembly 30, the first housing 510, the second housing 520, the first rear cover 580, and the second rear cover 590. On the first substrate 610 and the second substrate 620, electronic components for implementing various functions of the electronic device 10 may be mounted.

The first housing 510 and the second housing 520 may be assembled to be combined with both sides of the bracket assembly 30 in a state where the display unit 20 is combined with the bracket assembly 30. As will be described below, the first housing 510 and the second housing 520 may be combined with the bracket assembly 30 by sliding on both sides of the bracket assembly 30.

In an embodiment, the first housing 510 may have a first rotation supporting surface 512, and the second housing 520 may have a second rotation supporting surface 522 corresponding to the first rotation supporting surface 512. Each of the first and second rotation supporting surfaces 512 and 522 may have a curved surface corresponding to the curved surface included in the hinge cover 530.

In an embodiment, when the electronic device 10 is in the flat state (e.g., FIG. 1), the first and second rotation supporting surfaces 512 and 522 cover the hinge cover 530 so that the hinge cover 530 may not be exposed or be exposed in a relatively small amount to the rear surface of the electronic device 10. Meanwhile, when the electronic device 10 is in the folded state (e.g., FIG. 2), the first and second rotation supporting surfaces 512 and 522 rotate along the curved surfaces included in the hinge cover 530 so that the hinge cover 530 may be exposed to the rear surface of the electronic device 10.

Figure 4:
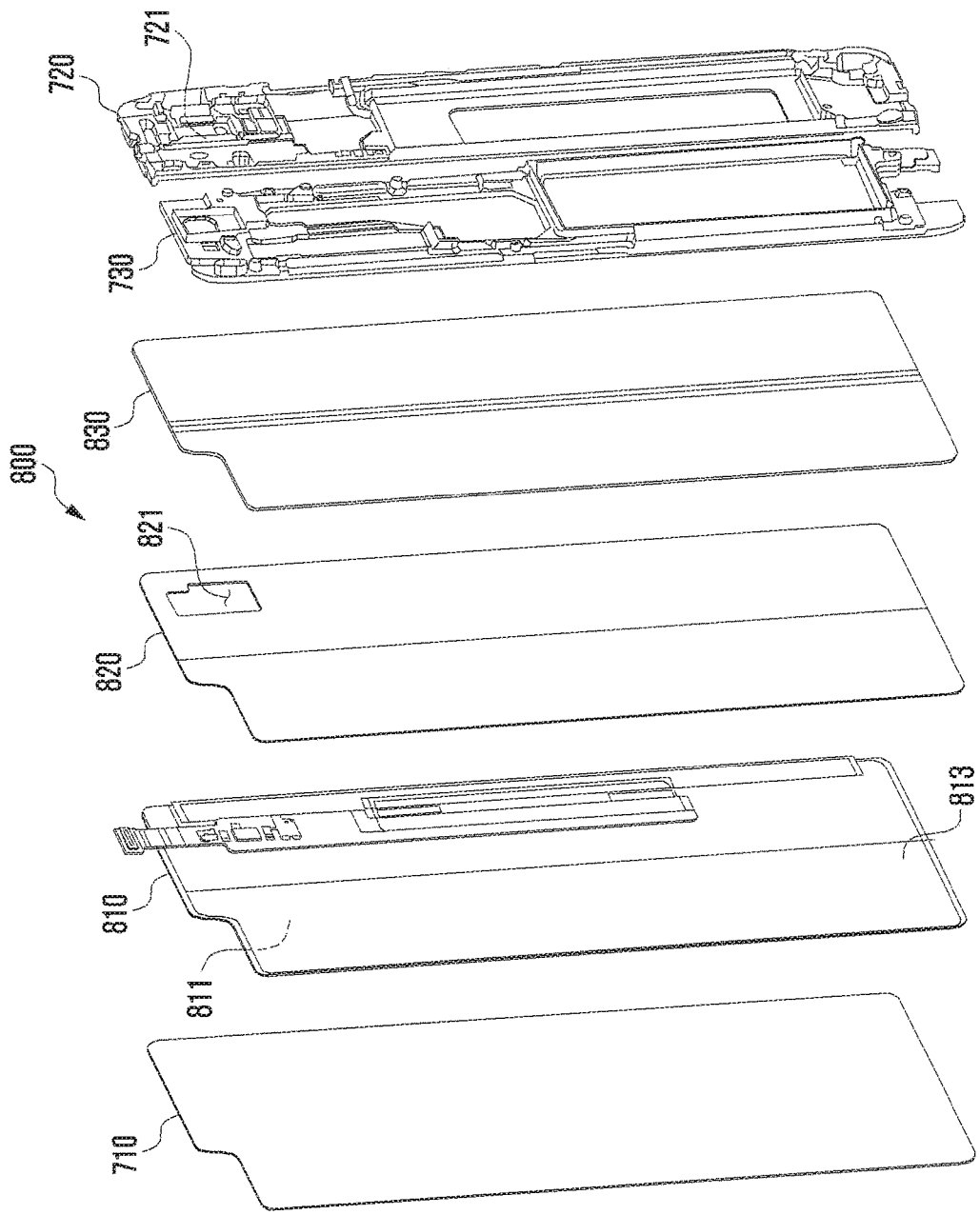
FIG. 4 is an exploded perspective view of an electronic device according to an embodiment of the disclosure.

FIG. 4 is an exploded perspective view of an electronic device according to an embodiment of the disclosure.

Referring to FIG. 4, the electronic device according to an embodiment may include a flexible display module 800, with a front plate 710, a display 810, middle plates 720 and 730, an adhesive layer 820, and/or a support layer 830.

The front plate 710 according to an embodiment may be disposed to face a first direction. The first direction may refer to a direction of a front surface of the electronic device. In FIG. 4, the first direction indicates an upward direction. The front plate 710 may refer to a window that has one surface exposed to the outside of the electronic device and receives a user's touch for manipulating a screen or entering an input action. In case of a foldable electronic device that is capable of being folded or unfolded, the front plate 710 should be folded or unfolded together with the electronic device. Thus, the front plate 710 may be formed of a material that is elastically deformable. For example, a plastic polymer material such as polyimide may be used.

Although not shown, a rear plate according to an embodiment may be disposed to face a second direction opposite to the first direction. The rear plate may be also disposed substantially parallel to the front plate 710. In addition, although not shown, a lateral member may be disposed to surround a space formed by both the front plate 710 and the rear plate. The lateral member may be formed integrally with or separately from the rear plate. The front plate 710, the rear plate, and the lateral member may constitute a housing that forms the overall appearance of the electronic device.

The middle plates 720 and 730 according to an embodiment may be disposed in the space between the front plate 710 and the rear plate and may each include a third surface facing the first direction. The third surface of the middle plate 720 may include a recess 721 formed as a concave shape in the second direction. The recess 721 may refer to a space in which various electronic components 817 (see FIG. 5) of the electronic device are arranged. For example, the electronic components 817 disposed in the recess 721 may include a display driver integrated circuit (IC) for controlling the display 810 to be described later.

The display 810 according to an embodiment may include a first surface 811 (e.g., a front surface) facing the first direction and a second surface 813 (e.g., a rear surface) facing the second direction. The display 810 may be a flexible display. The first surface 811 of the display 810 may be combined with the front plate 710, so that the display 810 may be folded together with the front plate 710. The display 810 combined with the front plate 710 may be viewed through at least a portion of the front plate 710. Although not shown, the display 810 may include a polarizer plate, a panel, a cushion layer, and the like. When power is supplied, the display 810 may emit light under the control of the display driver IC to display various kinds of information.

The support layer 830 according to an embodiment may be combined with the second surface 813 of the display 810. The support layer 830 may be formed of a material, such as a metallic material, that enables the formation of a thin film and guarantees a certain level of strength. For example, stainless steel may be used for the support layer 830. The support layer 830 may serve as a base frame such that the front plate 710 and the display 810, which are formed to be easily deformed, may maintain a flat shape. The support layer 830 may be mounted on and combined with the middle plates 720 and 730 or the rear plate to fasten the display 810 to the electronic device. In an illustrated example, the support layer 830 is combined with the middle plates 720 and 730. The support layer 830 may be divided into two parts along a central axis where the front plate 710 and the display 810 are folded.

In an embodiment, the support layer 830 and the display 810 may be combined with each other through the adhesive layer 820. The adhesive layer 820 may be, for example, a pressure sensitive adhesive (PSA). The adhesive layer 820 may combine the support layer 830 and the display 810 in a way of surface contact. The adhesive layer 820 may include a fourth surface attached to the second surface of the display and a fifth surface attached to the support layer 830. The adhesive layer 820 may be divided into two parts as resembling the support layer 830. A certain portion of the adhesive layer 820 may not combine the support layer 830 and the display 810. For example, an opening 821 may be formed in a first portion of the adhesive layer 820 without combining the support layer 830 and the display 810. The first portion of the adhesive layer 820 may correspond to the position of the recess 721 formed in the middle plate 720 when the support layer 830 is combined with the middle plates 720 and 730.

When an external force is applied to the electronic device according to an embodiment, the applied external force may be delivered to a certain portion of the support layer 830 and cause plastic deformation of the support layer 830. That is, a deformed portion of the support layer 830 may not be restored to its original state. For example, when a certain pressure is applied to the surface of the front plate 710 at a portion corresponding to the position of the recess 721 of the middle plate 720, the support layer 830 may be plastically deformed in a concave form. At this time, stress may be concentrated on portions of the support layer 830 being in contact with edges of the recess 721, and the support layer 830 may be bent along the edges of the recess 721 and sunk into the recess 721. As a result, the plastic deformation may occur.

In addition, when an external force is applied to the electronic device according to another embodiment, the applied external force may be delivered to a certain portion of the support layer 830 and cause temporary deformation of the support layer 830. Then, when the applied external force is removed, a deformed portion of the support layer 830 may be restored to its original state. For example, when a certain pressure is applied to the surface of the front plate 710 at a portion corresponding to the position of the recess 721 of the middle plate 720, the support layer 830 may be temporarily deformed in a concave form. At this time, stress may be concentrated on portions of the support layer 830 being in contact with edges of the recess 721, and the support layer 830 may be bent along the edges of the recess 721 and sunk into the recess 721. Thereafter, when the applied pressure is removed, the deformed support layer 830 may be restored to its original state by elasticity. In addition, forming the opening 821 in the adhesive layer 820 to partially separate the support layer 830 and the display 810 may prevent the deformation of the support layer 830 from being transferred to the display 810 and the front plate 710.

Figure 5:
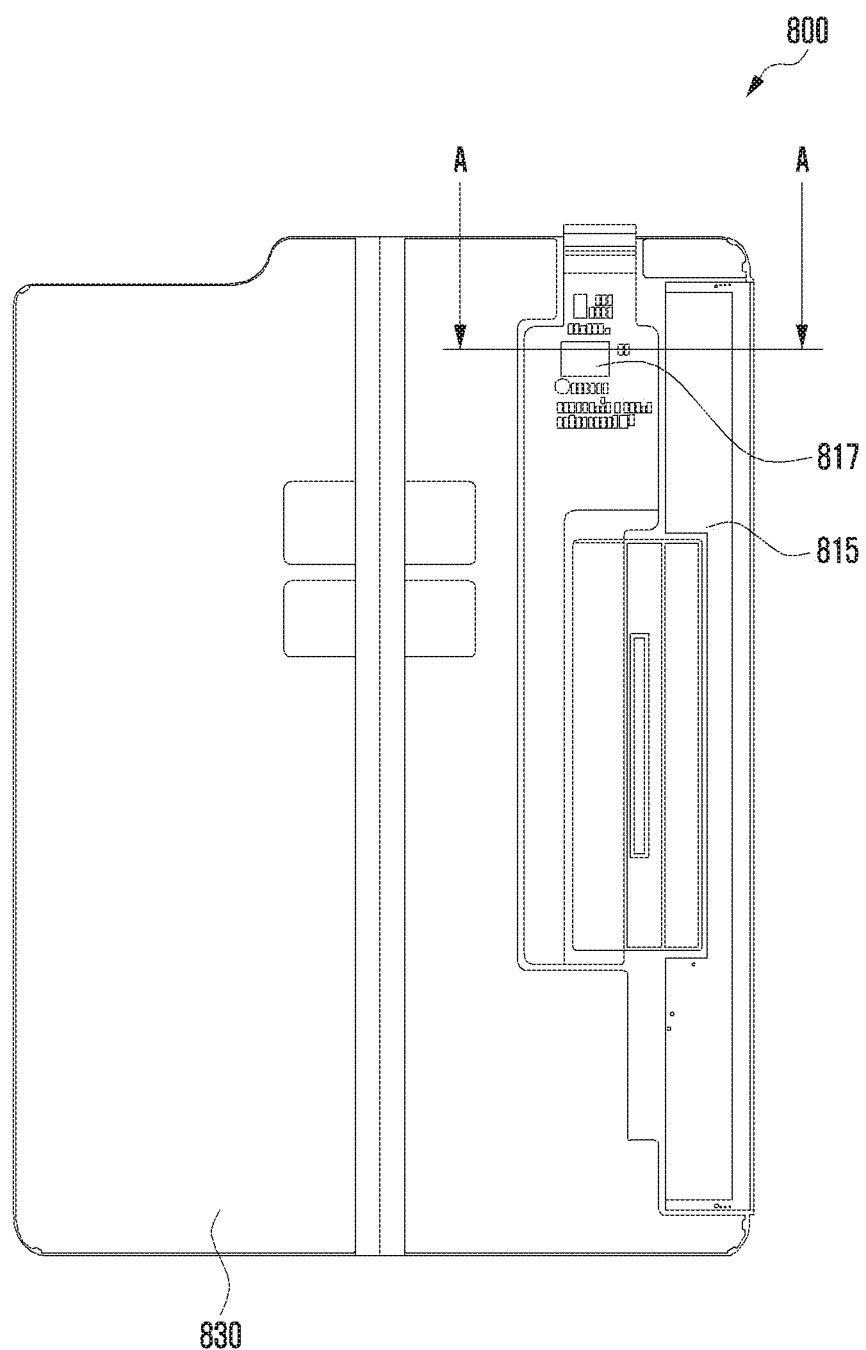
FIG. 5 is a view showing a flexible display module, seen from a direction of a second surface of a display, according to an embodiment of the disclosure.

FIG. 5 is a view showing a flexible display module, seen from a direction of a second surface of a display, according to an embodiment of the disclosure.

Referring to FIG. 5, a view is provided showing the flexible display module 800, seen from a direction of the second surface 813 (see FIG. 4) of the display 810 (see FIG. 4), according to an embodiment of the disclosure. That is, FIG. 5 shows a rear surface of the flexible display module 800.

According to an embodiment, on the rear surface of the flexible display module 800, a flexible printed circuit board (FPCB) 815 and the electronic components 817 such as a display driver IC for controlling the display 810 may be disposed. The FPCB 815 may extend from a lateral surface of the display 810 and bend toward the second surface 813. The electronic components 817 are accommodated in the recess 721 (see FIGS. 4 and 6) formed in the middle plate 720 (see FIGS. 4 and 6).

Figure 6:
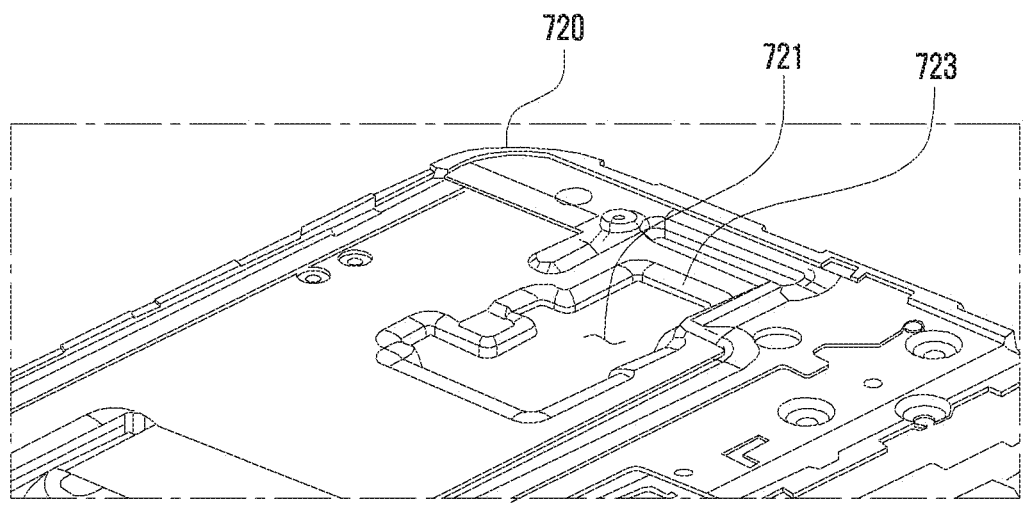
FIG. 6 is a perspective view showing a recess of an electronic device according to an embodiment of the disclosure.

FIG. 6 is a perspective view showing a recess of an electronic device according to an embodiment of the disclosure.

Referring to FIG. 6, the middle plate 720 may include the third surface facing the first direction, and include the recess 721 formed on the third surface to be recessed in the second direction. The recess 721 may refer to a certain space for accommodating various electronic components 817 (see FIG. 5) disposed in the electronic device. Depending on the number and positions of such electronic components 817 embedded in the electronic device, a plurality of recesses may be formed at different locations. For example, as shown in FIG. 5, the recess 721 may be formed to correspond to a position where the electronic components 817 such as the display driver IC are disposed. The recess 721 may have a depth corresponding to the thickness of the electronic components 817 to prevent an increase in overall thickness of the electronic device with edges 723.

Figure 7A:
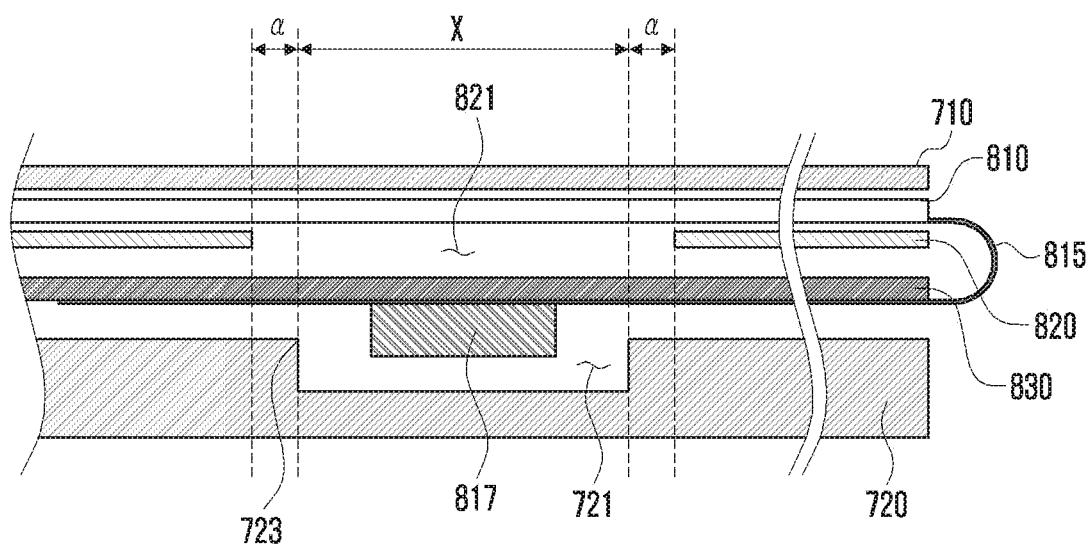
FIGS. 7A and 7B are cross-sectional views showing an electronic device according to various embodiments of the disclosure.
Figure 7B:
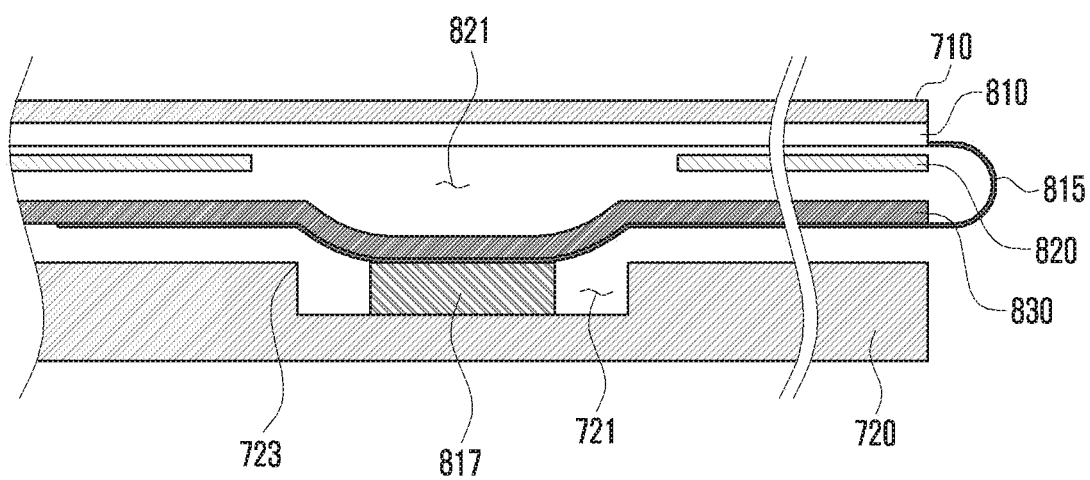

FIGS. 7A and 7B are cross-sectional views showing an electronic device according to various embodiments of the disclosure.

FIGS. 7A and 7B correspond to cross-sectional views taken along the line A-A of FIG. 5. Specifically, FIG. 7A shows a state before an external force is applied to the electronic device, and FIG. 7B shows a state after an external force is applied to the electronic device. Although FIGS. 7A and 7B depict respective layers as being separated from each other, this is merely for convenience of distinction between adjacent layers. In fact, neighboring layers are attached to each other or very close together.

Referring to FIGS. 7A and 7B, when an external force is applied to the electronic device, especially when the external force is applied to a specific portion of the support layer 830, the support layer 830 may be plastically deformed and may not be restored to its original state. For example, when an external force is applied to a portion of the surface of the front plate 710 corresponding to the recess 721 of the middle plate 720 or the first portion of the adhesive layer 820, the support layer 830 may be plastically deformed in a concave form. At this time, stress may be concentrated on portions of the support layer 830 being in contact with edges 723 of the recess 721, and the support layer 830 may be bent along the edges 723 of the recess 721 and sunk into the recess 721. As a result, the plastic deformation may occur. If the support layer 830 and the display 810 are attached as a whole by the adhesive layer 820, the shape of the plastically deformed support layer 830 may be transferred to the front plate 710. As a result, the user may recognize this.

However, in the electronic device according to an embodiment as shown in FIGS. 7A and 7B, the opening 821 is formed in the first portion of the adhesive layer 820 to partially remove the adhesive layer 820 and thereby partially separate the support layer 830 and the display 810. The formation position of the opening 821 corresponds to the recess 721. By forming the opening 821, the deformed shape of the support layer 830 may not be transferred to the display 810 and the front plate 710 even when the support layer 830 is plastically deformed by an external force.

In an embodiment, the area of the opening 821 formed in the adhesive layer 820 may be greater than that of the recess 721. Referring to the cross-sectional view of FIG. 7A, when the recess 721 has a width as indicated by 'X', the opening 821 may be formed to have a greater width by 'α' on each side. In other words, the width of the opening 821 may become 'X+2α'. Forming the opening 821 to be greater than the recess 721 is for effectively preventing the deformation of the support layer 830 from being transferred to the display 810 and the front plate 710.

Figure 8A:
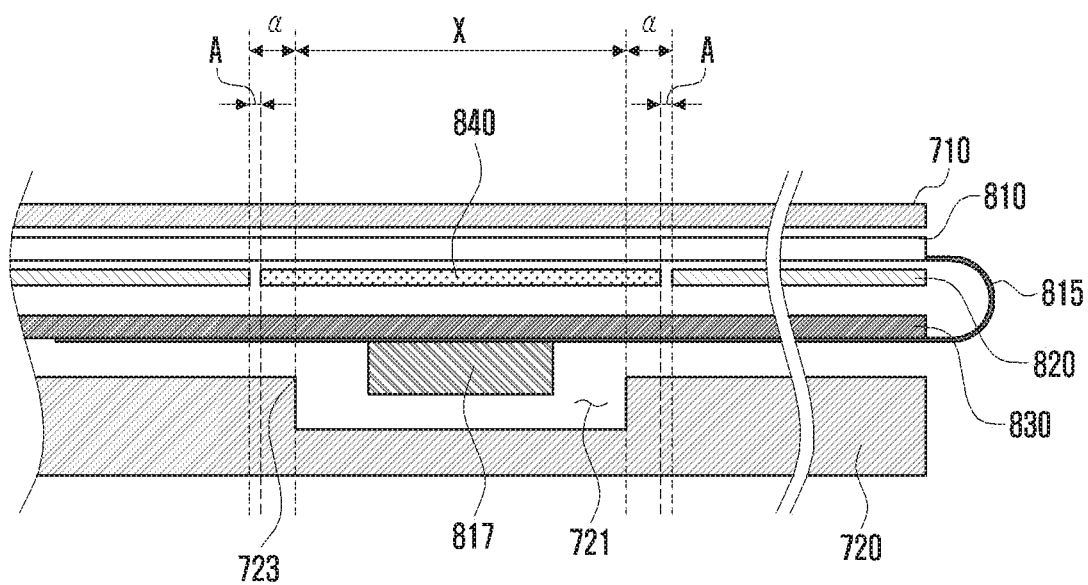
FIGS. 8A and 8B are cross-sectional views showing an electronic device including a support plate according to various embodiments of the disclosure.
Figure 8B:
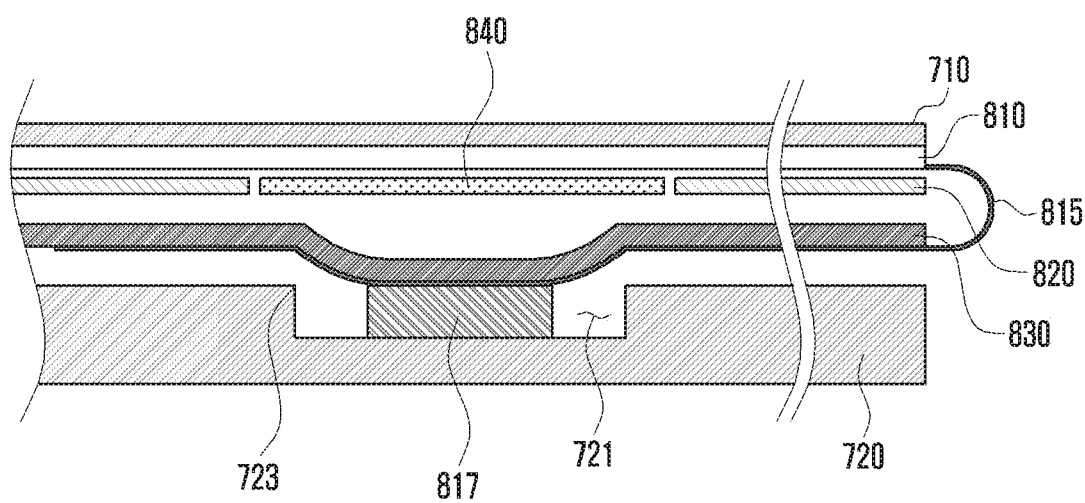

FIGS. 8A and 8B are cross-sectional views showing an electronic device according to various embodiments of the disclosure.

FIGS. 8A and 8B correspond to cross-sectional views taken along the line A-A of FIG. 5. Specifically, FIG. 8A shows a state before an external force is applied to the electronic device, and FIG. 8B shows a state after an external force is applied to the electronic device. Although FIGS. 8A and 8B depict respective layers as being separated from each other, this is merely for convenience of distinction between adjacent layers. In fact, neighboring layers are attached to each other or very close together.

Referring to FIGS. 8A and 8B, as similar to FIGS. 7A and 7B, the opening 821 is formed in the first portion of the adhesive layer 820 to partially remove the adhesive layer 820 and thereby partially separate the support layer 830 and the display 810. The formation position of the opening 821 corresponds to the recess 721. By forming the opening 821, the deformed shape of the support layer 830 may not be transferred to the display 810 and the front plate 710 even when the support layer 830 is plastically deformed by an external force.

Even if the adhesive layer 820 has a very small thickness, an empty space between the display 810 and the support layer 830, produced by the opening 821 of the adhesive layer 820, may be unfavorable. Therefore, the electronic device according to another embodiment may further include a support plate 840 that is disposed in the opening 821. The support plate 840 is for almost removing the empty space between the display 810 and the support layer 830. The support plate 840 may have the same thickness as or a smaller thickness than that of the adhesive layer 820.

The support plate 840 may include a sixth surface facing the first direction and a seventh surface facing the second direction. The sixth surface of the support plate 840 may be a surface in contact with the display 810, and the seventh surface may be a surface in contact with the support layer 830. The support plate 840 may fill the empty space between the display 810 and the support layer 830 and prevent the display 810 and the support layer 830 from meeting. In order for the support plate 840 to be stably disposed in the opening 821 of the adhesive layer 820, an adhesive material may be coated on the sixth or seventh surface to be attached to the display 810 or the support layer 830.

In this embodiment, the area of the opening 821 formed in the adhesive layer 820 may be greater than that of the recess 721. Referring to the cross-sectional view of FIG. 8A, when the recess 721 has a width as indicated by 'X', the opening 821 may be formed to have a greater width by 'α' on each side. In other words, the width of the opening 821 may become 'X+2α'. Forming the opening 821 to be greater than the recess 721 is for effectively preventing the deformation of the support layer 830 from being transferred to the display 810 and the front plate 710. In addition, the support plate 840 may be larger than the recess 721 but smaller than the opening 821. The support plate 840 may be formed as small as 'A' on each side than the opening 821. In other words, the width of the support plate 840 may become 'X+2(α−A)'.

Figure 9:
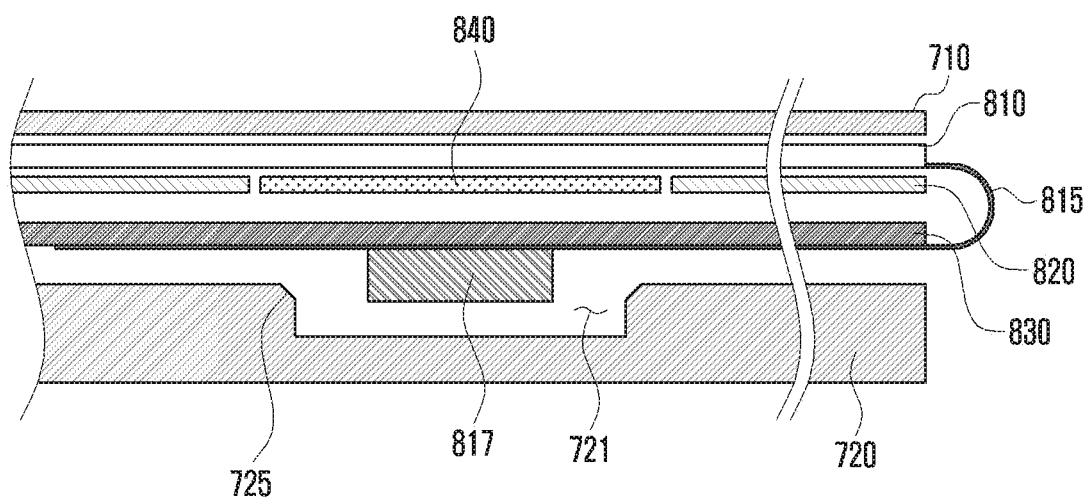
FIG. 9 is a cross-sectional view showing a recess having a modified edge in an electronic device according to an embodiment of the disclosure.

FIG. 9 is a cross-sectional view showing a recess having a modified edge in an electronic device according to an embodiment of the disclosure.

Referring to FIG. 9, a cross-sectional view is provided showing the recess 721 having a modified edge 725 in an electronic device according to an embodiment of the disclosure. Although FIG. 9 depicts respective layers as being separated from each other, this is merely for convenience of distinction between adjacent layers. In fact, neighboring layers are attached to each other or very close together.

As described above, when an external force is applied to the electronic device, especially when an external force is applied to a portion of the surface of the front plate 710 corresponding to the recess 721 of the middle plate 720 or the first portion of the adhesive layer 820, the support layer 830 may be plastically deformed in a concave form. At this time, stress may be concentrated on portions of the support layer 830 being in contact with edges of the recess 721, and the support layer 830 may be bent along the edges of the recess 721 and sunk into the recess 721. As a result, the plastic deformation may occur. Therefore, in this embodiment, the edges of the recess 721 may be modified through a rounding or chamfering process. The modified edges 725 may reduce stress concentration and thereby minimize plastic deformation of the support layer 830.

Figure 10:
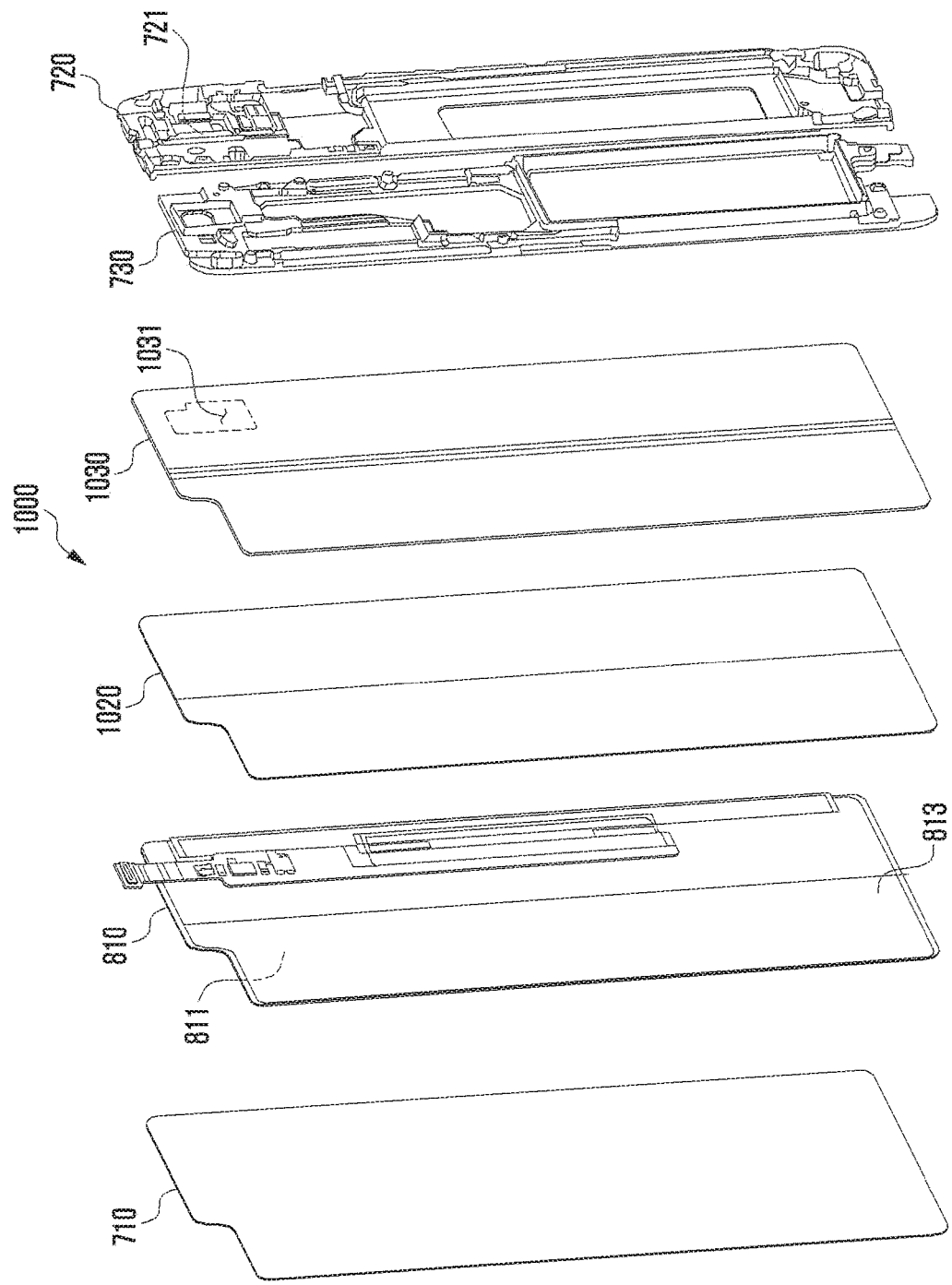
FIG. 10 is an exploded perspective view of an electronic device according to an embodiment of the disclosure.
Figure 11:
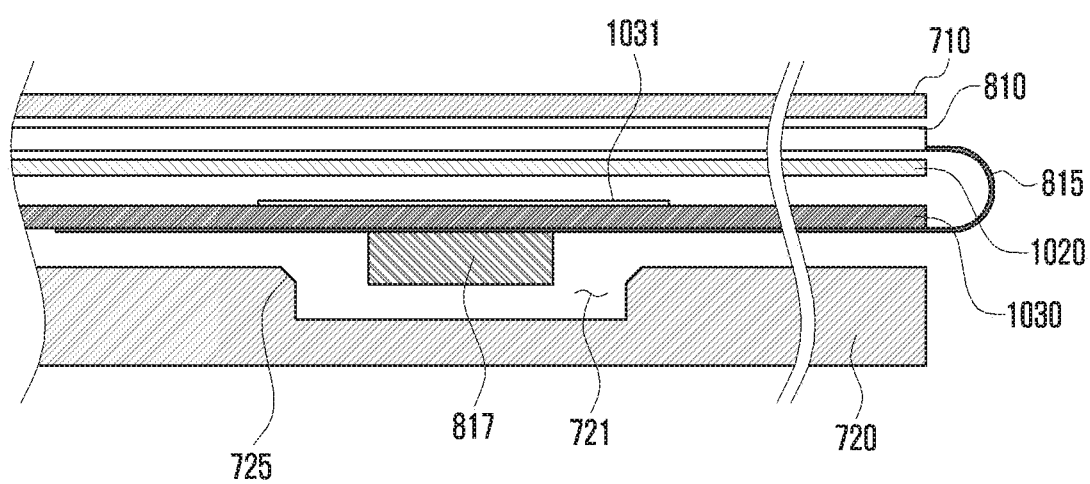
FIG. 11 is a cross-sectional view of an electronic device according to an embodiment of the disclosure.

FIG. 10 is an exploded perspective view of an electronic device according to an embodiment of the disclosure, and FIG. 11 is a cross-sectional view of the electronic device shown in FIG. 10 according to an embodiment of the disclosure.

Referring to FIGS. 10 and 11, the electronic device according to an embodiment may include a flexible display module 1000, with the front plate 710, the display 810 with the first surface 811 and second surface 813, the middle plates 720 and 730 with recess 721, and a coating layer 1031 interposed between a support layer 1030 and an adhesive layer 1020. Although FIG. 11 depicts respective layers as being separated from each other, this is merely for convenience of distinction between adjacent layers. In fact, neighboring layers are attached to each other or very close together.

In the following description, differences between the electronic device shown in FIGS. 10 and 11 and the electronic device shown in FIG. 4 will be discussed in greater detail.

In this embodiment, the support layer 1030 and the display 810 may be combined with each other through the adhesive layer 1020. The adhesive layer 1020 may be a pressure sensitive adhesive (PSA), for example, and may combine the support layer 1030 and the display 810 in a way of surface contact.

However, it is possible to partially separate the support layer 1030 and the display 810. For example, the coating layer 1031 may be formed in a first portion of the support layer 1030 so as to separate the support layer 1030 and the adhesive layer 1020. The first portion of the support layer 1030 may correspond to the position of the recess 721 formed in the middle plate 720.

The coating layer 1031 may be disposed between the support layer 1030 and the adhesive layer 1020. The coating layer 1031 may be separately manufactured and disposed, or may be formed by surface treatment of the support layer 1030 or the adhesive layer 1020. For example, the coating layer 1031 may be a silver (Ag) coating, an aluminum (Al) coating, or an anti-finger (AF) print coating. The thickness of the coating layer 1031 may be about 5 μm. The area of the coating layer 1031 may be greater than that of the recess 721.

Figure 12:
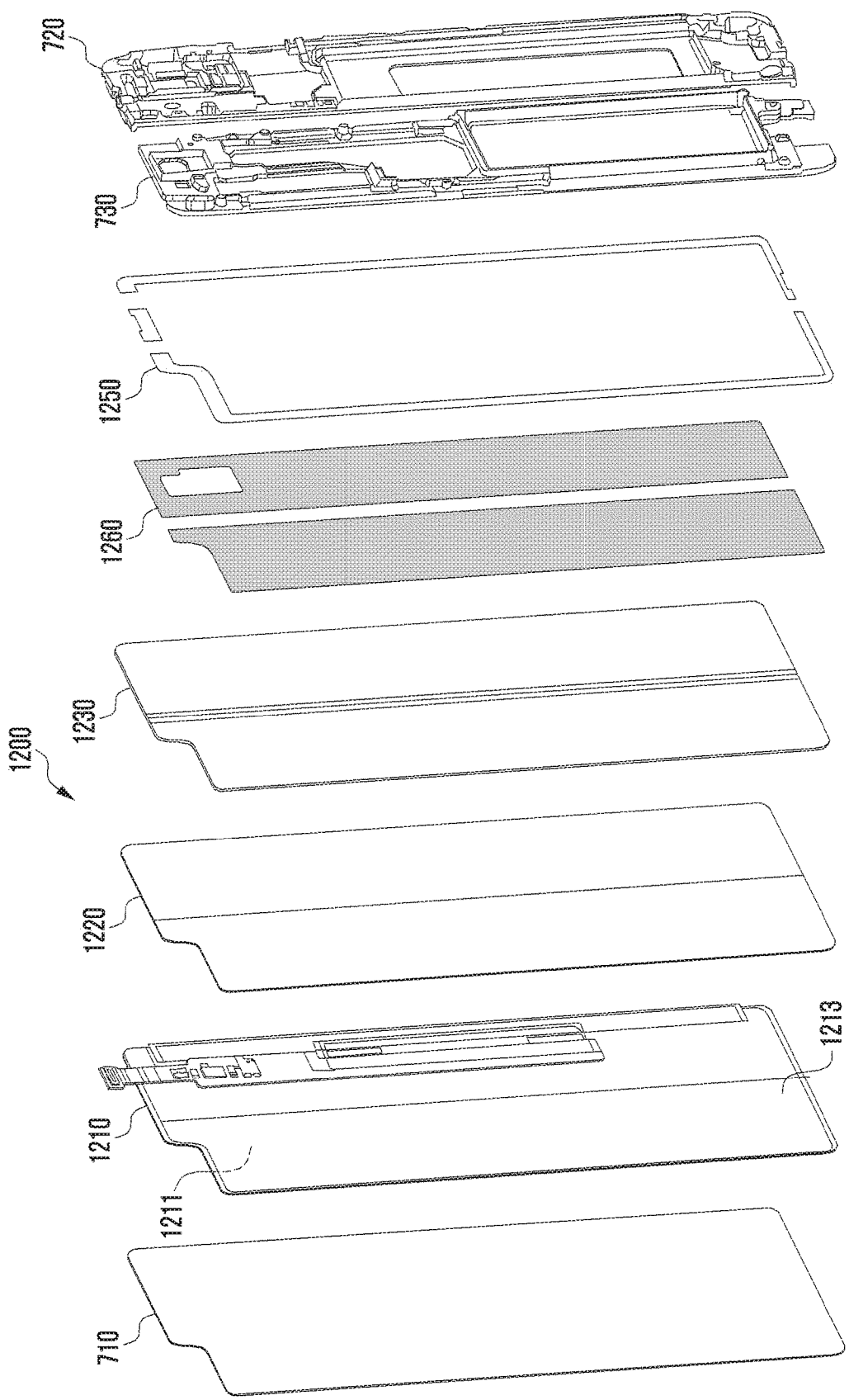
FIG. 12 is an exploded perspective view of an electronic device according to an embodiment of the disclosure.
Figure 13:
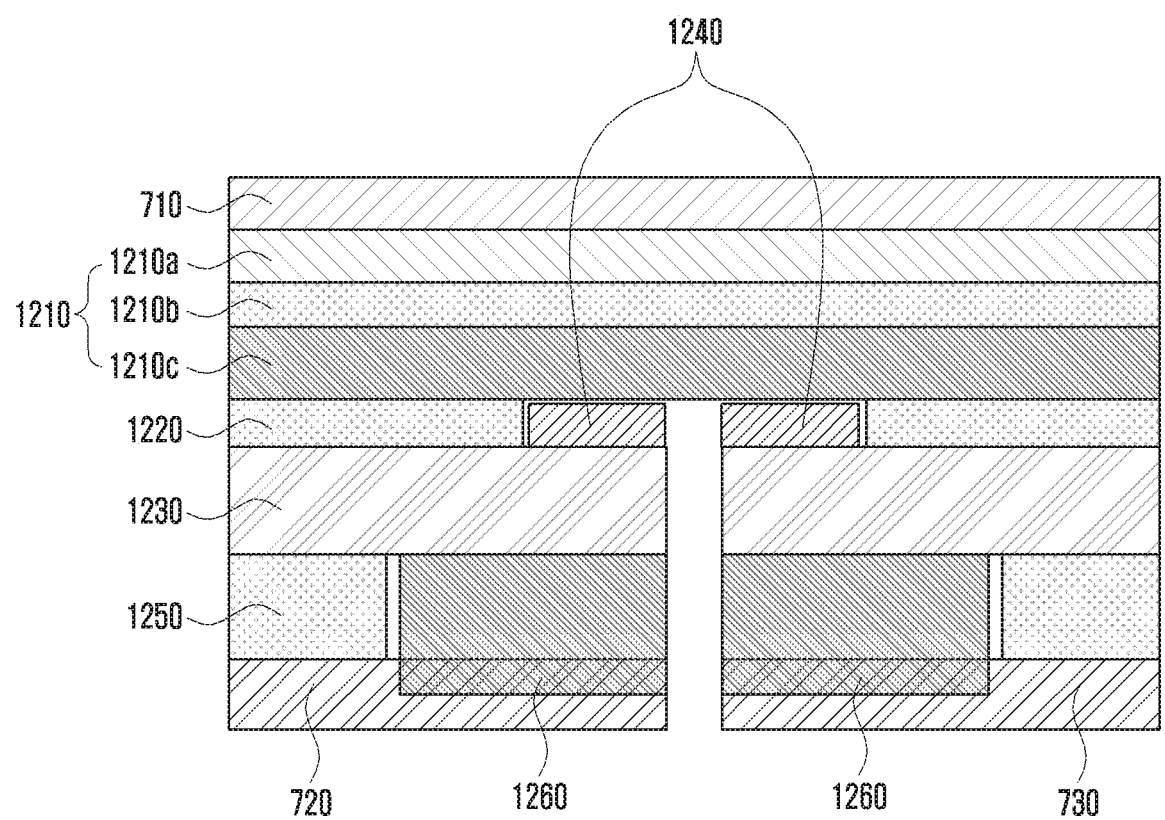
FIG. 13 is a cross-sectional view of an electronic device according to an embodiment of the disclosure.

FIG. 12 is an exploded perspective view of an electronic device according to an embodiment of the disclosure, and FIG. 13 is a cross-sectional view of an electronic device according to an embodiment of the disclosure.

Referring to FIGS. 12 and 13, the electronic device according to various embodiments may include a flexible display module 1200, with the front plate 710, a display 1210, the middle plates 720 and 730, an adhesive layer 1220, a support layer 1230, a support plate 1240, an edge adhesive layer 1250, and/or a buffer layer 1260.

The front plate 710 may refer to a window that receives a user's touch for manipulating a screen or entering an input action. In case of a foldable electronic device that is capable of being folded or unfolded, the front plate 710 should be folded or unfolded together with the electronic device. Thus, the front plate 710 may be formed of a material that is elastically deformable. For example, a plastic polymer material such as polyimide may be used.

The display 1210 may be a flexible display. The display 1210 may be combined with the front plate 710 through a first surface 1211 thereof, so that the display 1210 may be folded together with the front plate 710. The display 1210 may be composed of a panel 1210a, a cushion layer 1210c, a panel adhesive 1210b, and the like. When power is supplied, the display 1210 may emit light under the control of the display driver IC to display various kinds of information.

The middle plates 720 and 730 may offer places for arranging various kinds of electronic components embedded in the electronic device. The middle plates 720 and 730 may include various structures, such as recesses, holes, and protrusions, for mounting various electronic components. Therefore, the surfaces of the middle plates 720 and 730 may be uneven, and irregularities or operations may be formed.

The support layer 1230 may be combined with a second surface 1213 of the display 1210. The support layer 1230 may be formed of a material, such as a metallic material, that enables the formation of a thin film and guarantees a certain level of strength. For example, the support layer 1230 may be formed of stainless steel or a clad which is a combination of stainless steel and aluminum. The support layer 1230 may serve as a base frame such that the front plate 710 and the display 1210, which are formed to be easily deformed, may maintain a flat shape. The support layer 1230 may be divided into two parts along a central axis where the front plate 710 and the display 1210 are folded.

The support layer 1230 and the display 1210 may be combined with each other through the adhesive layer 1220. The adhesive layer 1220 may be, for example, a pressure sensitive adhesive (PSA).

The support plate 1240 may fill an empty space (i.e., a space having no adhesive) formed between the display 1210 and the support layer 1230. The support plate 1240 may have the same thickness as or a smaller thickness than that of the adhesive layer 1220.

The edge adhesive layer 1250 may combine edges of the support layer 1230 and edges of the middle plates 720 and 730. The edge adhesive layer 1250 may be formed to have an area sufficient to overcome an elastic force of the buffer layer 1260 and sufficiently secure a combining force between the support layer 1230 and the middle plates 720 and 730. The edge adhesive layer 1250 may be divided into two parts at an axis along which the support layer 1230 is folded.

The buffer layer 1260 may be positioned between the support layer 1230 and the middle plates 720 and 730. In addition, the buffer layer 1260 may be disposed on the same layer as the edge adhesive layer 1250 without overlapping with the edge adhesive layer 1250. For example, the buffer layer 1260 may be disposed in portions of the middle plates 720 and 730 except for a portion where the edge adhesive layer 1250 is disposed. The buffer layer 1260 may be formed of a sponge or any other elastic material. The buffer layer 1260 may be combined with the support layer 1230 through one surface thereof, and may be divided into two parts along an axis of folding the support layer 1230. The buffer layer 1260 may be formed thicker than the edge adhesive layer 1250. The buffer layer 1260 may be partially compressed when the support layer 1230 and the middle plates 720 and 730 are attached by the edge adhesive layer 1250.

When a flexible display module 1200 according to various embodiments is mounted on the middle plates 720 and 730, surface irregularities or operations of the middle plates 720 and 730 may be visually recognized to the user through the front plate 710. Specifically, when irregularities or operations are formed on the surfaces of the middle plates 720 and 730, gaps between the support layer 1230 of the flexible display module 1200 and the middle plates 720 and 730 may be narrow in certain portions and relatively wide in the other portions. This may cause the front plate 710 to be much deformed toward the middle plates 720 and 730 in portions having wide gaps and less deformed in portions having narrow gaps. As a result, the front plate 710 may have an uneven surface, and a curvy or wavy phenomenon may appear on the front plate 710. The buffer layer 1260 according to various embodiments may absorb the surface irregularities or operations of the middle plates 720 and 730 and elastically support the support layer 1230 with an elastic force generated by compression. Elastically supporting the support layer 1230 through the buffer layer 1260 may prevent the curvy or wavy phenomenon from appearing on the front plate 710 and allow the front plate 710 to have an even surface.

According to an embodiment of the disclosure, an electronic device may include a housing including a front plate 710 facing a first direction, a rear plate facing a second direction opposite to the first direction, and a lateral member surrounding a space between the front plate 710 and the rear plate, a display 810 seen through at least a portion of the front plate 710 and including a first surface 811 facing the first direction and a second surface 813 facing the second direction, a middle plate 720 and 730 disposed between the display 810 and the rear plate, including a third surface facing the second surface 813 of the display 810, and including a recess 721 formed on the third surface, an adhesive layer 820 attached to the second surface 813 of the display 810 and including an opening 821 formed in a first portion overlapped with the recess 721 when viewed from the display 810, and a support layer 830 disposed between the adhesive layer 820 and the middle plate 720 and 730.

The display 810 may include a flexible display.

The display 810 may include a flexible printed circuit board 815 extending from a lateral surface of the display 810 and bent toward the second surface 813, and at least one electronic component 817 mounted on the flexible printed circuit board 815 and facing the second direction.

The recess 721 may accommodate the at least one electronic component 817.

The opening 821 may have an area greater than an area of the recess 721 when viewed from the display 810.

The electronic device may further include a support plate 840 disposed in the opening 821 and attached to the second surface 813 of the display 810, and the support plate 840 may include a sixth surface facing the first direction and a seventh surface facing the second direction, include an adhesive material between the sixth surface and the second surface 813, and include no adhesive material between the seventh surface and the support layer 830.

The support plate 840 may have a same thickness as or a smaller thickness than a thickness of the adhesive layer 820.

The electronic device may further include a support plate 840 disposed in the opening 821 between the display 810 and the support layer 830 and including a sixth surface facing the first direction and a seventh surface facing the second direction.

The support plate 840 may include an adhesive material between the sixth surface and the second surface 813, and include no adhesive material between the seventh surface and the support layer 830.

The support plate 840 may include no adhesive material between the sixth surface and the second surface 813, and include an adhesive material between the seventh surface and the support layer 830.

An edge of the recess 721 may be modified through a rounding or chamfering process.

According to an embodiment of the disclosure, an electronic device may include a housing including a front plate 710 facing a first direction, a rear plate facing a second direction opposite to the first direction, and a lateral member surrounding a space between the front plate 710 and the rear plate, a display 810 seen through at least a portion of the front plate 710 and including a first surface 811 facing the first direction and a second surface 813 facing the second direction, a middle plate 720 and 730 disposed between the display 810 and the rear plate, including a third surface facing the second surface 813 of the display 810, and including a recess 721 formed on the third surface, an adhesive layer 1020 attached to the second surface 813 of the display 810, a support layer 1030 disposed between the adhesive layer 1020 and the middle plate 720 and 730, and a coating layer 1031 disposed between the support layer 1030 and the adhesive layer 1020 and disposed in a first portion overlapped with the recess 721 when viewed from the display 810.

The coating layer 1031 may have an area greater than an area of the recess 721 when viewed from the display 810.

The coating layer 1031 may include at least one of a silver (Ag) coating, an aluminum (Al) coating, or an anti-finger (AF) print coating.

According to an embodiment of the disclosure, a flexible display module 800, 1000 or 1200 may include a front plate 710 facing a first direction and being foldable, a display 810 seen through at least a portion of the front plate 710 and including a first surface facing the first direction and a second surface facing a second direction opposite to the first direction, an adhesive layer 820 or 1020 attached to the second surface of the display 810, a support layer 830 or 1030 combined with the adhesive layer 820, and a coating layer 1020 disposed at least in part between the support layer 830 or 1030 and the adhesive layer 820 or 1020.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a housing comprising:
      a front plate facing a first direction,
      a rear plate facing a second direction opposite to the first direction, and
      a lateral member surrounding a space between the front plate and the rear plate;
   a display configured to be seen through at least a portion of the front plate, the display comprising:
      a first surface facing the first direction, and
      a second surface facing the second direction;
   a middle plate disposed between the display and the rear plate, the middle plate comprising:
      a third surface facing the second surface of the display, and
      a recess formed on the third surface;
   an adhesive layer attached to the second surface of the display;
   a support layer disposed between the adhesive layer and the middle plate; and
   a coating layer,
   wherein the coating layer is disposed between the support layer and the adhesive layer, and
   wherein the coating layer is disposed in a first portion overlapped with the recess.

2. The electronic device of claim 1, wherein the display comprises a flexible display.

3. The electronic device of claim 1, wherein the display comprises:
   a flexible printed circuit board extending from a lateral surface of the display and bent toward the second surface; and
   at least one electronic component mounted on the flexible printed circuit board and facing the second direction.

4. The electronic device of claim 3, wherein the recess is configured to accommodate the at least one electronic component.

5. The electronic device of claim 1, wherein the coating layer has an area greater than an area of the recess when viewed from the display.

6. An electronic device comprising:
   a housing comprising:
      a front plate facing a first direction,
      a rear plate facing a second direction opposite to the first direction, and
      a lateral member surrounding a space between the front plate and the rear plate;
   a display configured to be seen through at least a portion of the front plate, the display comprising:
      a first surface facing the first direction, and
      a second surface facing the second direction;
   a middle plate disposed between the display and the rear plate, the middle plate comprising:
      a third surface facing the second surface of the display, and
      a recess formed on the third surface;
   an adhesive layer attached to the second surface of the display, the adhesive layer comprising an opening formed in a first portion overlapped with the recess; and
   a support layer disposed between the adhesive layer and the middle plate.

7. The electronic device of claim 6, wherein the display comprises a flexible display.

8. The electronic device of claim 6, wherein the display comprises:
a flexible printed circuit board extending from a lateral surface of the display and bent toward the second surface; and
at least one electronic component mounted on the flexible printed circuit board and facing the second direction.

9. The electronic device of claim 8, wherein the recess is configured to accommodate the at least one electronic component.

10. The electronic device of claim 6, wherein the opening has an area greater than an area of the recess when viewed from the display.

11. The electronic device of claim 6, further comprising:
a support plate disposed in the opening and attached to the second surface of the display,
wherein the support plate comprises:
a sixth surface facing the first direction, and
a seventh surface facing the second direction,
an adhesive material between the sixth surface and the second surface, and
no adhesive material between the seventh surface and the support layer.

12. The electronic device of claim 11, wherein the support plate has a same thickness as or a smaller thickness than a thickness of the adhesive layer.

13. The electronic device of claim 6, further comprising:
a support plate disposed in the opening between the display and the support layer,
wherein the support layer comprises:
a sixth surface facing the first direction, and
a seventh surface facing the second direction.

14. The electronic device of claim 13, wherein the support plate comprises:
an adhesive material between the sixth surface and the second surface, and
no adhesive material between the seventh surface and the support layer.

15. The electronic device of claim 13, wherein the support plate comprises:
no adhesive material between the sixth surface and the second surface, and
an adhesive material between the seventh surface and the support layer.

16. The electronic device of claim 6, wherein an edge of the recess is rounded or chamfered.

17. A flexible display module comprising:
a front plate facing a first direction and configured to be foldable;
a display configured to be seen through at least a portion of the front plate, the display comprising:
a first surface facing the first direction, and
a second surface facing a second direction opposite to the first direction;
an adhesive layer attached to the second surface of the display;
a support layer combined with the adhesive layer;
a middle plate disposed in the second direction from the support layer and including a recess formed on a third surface facing the second surface of the display; and
a coating layer disposed between the support layer and the adhesive layer and disposed in a first portion overlapped with the recess.

18. An electronic device comprising:
a front plate facing a first direction and configured to be foldable;
a plurality of rear plates facing a second direction opposite to the first direction, each of the rear plates being disposed to be separated from each other with respect to a central axis of the electronic device;
a display configured to be seen through at least a portion of the front plate and to be combined with the front plate so that the display can be folded together with the front plate;
a plurality of middle plates disposed between the display and the plurality of rear plates, each of the middle plates respectively comprising a portion for mounting at least one electronic component, and being disposed to be separated from each other with respect to the central axis of the electronic device;
a support layer supporting the display and comprising two parts separated from each other with respect to the central axis of the electronic device, wherein a first part of the two parts of the support layer is disposed between a first middle plate of the plurality of middle plates and the display, and a second part of the two parts of the support layers is disposed between a second middle plate of the plurality of middle plates and the display; and
a buffer layer comprising two parts separated from each other with respect to the central axis of the electronic device, wherein a first part of the two parts of the buffer layer is disposed between the first part of the two parts of the support layers and the first middle plate of the plurality of middle plates, and a second part of the two parts of the buffer layers is disposed between the second part of the two parts of the support layers and the second middle plate of the plurality of middle plates.

19. The electronic device of claim 18, further comprising:
a plurality of support plates being disposed to be separated from each other with respect to the central axis of the electronic device,
wherein a first support plate of the plurality of support plates is disposed between the first part of the two parts of the support layers and the display, and a second support plate of the plurality of support plates is disposed between the second part of the two parts of the support layers and the display.

20. The electronic device of claim 19, further comprising:
a plurality of adhesive layers being disposed to be separated from each other with respect to the central axis of the electronic device,
wherein a first adhesive layer of the plurality of adhesive layers is disposed between the first part of the two parts of the support layers and the display, and a second adhesive layer of the plurality of adhesive layers is disposed between the second part of the two parts of the support layers and the display, and
wherein the support plates are located in an empty space between the adhesive layers.

* * * * *